United States Patent
Sunaga et al.

(10) Patent No.: US 9,484,128 B2
(45) Date of Patent: Nov. 1, 2016

(54) NOISE SUPPRESSION CABLE

(71) Applicant: Hitachi Metals, Ltd., Tokyo (JP)

(72) Inventors: Yoshinori Sunaga, Hitachinaka (JP); Takahiro Sugiyama, Hitachi (JP); Naofumi Chiwata, Mito (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 14/622,666

(22) Filed: Feb. 13, 2015

(65) Prior Publication Data
US 2015/0235740 A1 Aug. 20, 2015

(30) Foreign Application Priority Data
Feb. 19, 2014 (JP) .................. 2014-029736

(51) Int. Cl.
*H01B 7/00* (2006.01)
*H01B 9/02* (2006.01)
*H05K 9/00* (2006.01)

(52) U.S. Cl.
CPC ............ *H01B 9/021* (2013.01); *H05K 9/0098* (2013.01); *H01B 9/023* (2013.01)

(58) Field of Classification Search
CPC .......................... H01B 11/06; H01B 11/1083
USPC .................... 174/106 R, 108, 109
See application file for complete search history.

(56) References Cited

U.S. PATENT DOCUMENTS

| | | | | |
|---|---|---|---|---|
| 3,215,768 A | * | 11/1965 | Murphy | H01B 9/024 156/54 |
| 4,816,614 A | | 3/1989 | Baigrie et al. | |
| 5,132,491 A | * | 7/1992 | Mulrooney | H01B 11/1826 174/105 SC |
| 5,349,133 A | * | 9/1994 | Rogers | H01B 11/1033 174/106 R |
| 6,259,019 B1 | * | 7/2001 | Damilo | H01B 13/262 174/102 R |
| 8,217,267 B2 | * | 7/2012 | Nordin | H01B 11/1008 174/102 R |

FOREIGN PATENT DOCUMENTS

| | | |
|---|---|---|
| JP | 62-190609 A | 8/1987 |
| JP | 06-203652 A | 7/1994 |

* cited by examiner

*Primary Examiner* — Chau N Nguyen
(74) *Attorney, Agent, or Firm* — McGinn IP Law Group, PLLC

(57) ABSTRACT

A noise suppression cable includes an insulated wire, an internal magnetic tape layer including a resin layer and a magnetic material layer formed on one surface of the resin layer, the internal magnetic tape layer being spirally wound on a periphery of the insulated wire in a first direction along a longitudinal direction of the cable so as to allow the magnetic material layer of the internal magnetic tape layer to face outside, and an external magnetic tape layer including a resin layer and a magnetic material layer formed on one surface of the resin layer, the external magnetic tape layer being spirally wound on a periphery of the internal magnetic tape layer in a second direction different from the first direction along the longitudinal direction of the cable so as to allow the magnetic material layer of the external magnetic tape layer to face inside.

16 Claims, 5 Drawing Sheets

NOISE SUPPRESSION CABLE

The present application is based on Japanese patent application No. 2014-029736 filed on Feb. 19, 2014, the entire contents of which are incorporated herein by reference.

BACKGROUND OF THE INVENTION

1. Field of the Invention

This invention relates to a noise suppression cable. In particular, this invention relates to a noise suppression cable that uses a magnetic tape including a resin layer and an internal magnetic tape layer.

2. Description of the Related Art

In recent years, an inverter is frequently used for an electric power system, thus it is becoming important that an electromagnetic wave noise radiated from a cable of the electric power system is suppressed. As one of methods for suppressing the electromagnetic wave noise, it is generally used to pass the cable through a ring-shaped ferrite core, but by reason of that the core causes disturbance, the assembling is troublesome, the depression of noise is insufficient, and the like, a cable configured such that the cable itself has a noise suppression effect is required.

Thus, a shield electric wire has been proposed in which the cable itself functions to have the noise suppression effect (e.g. refer to JP-H06-203652). The shield electric wire is configured such that a magnetic material tape is wound around the core wires of the cable and a sheath is covered thereon without gaps. The magnetic material tape is obtained by forming a soft magnetic material with a high magnetic permeability such as amorphous into a tape shape.

Also, a high frequency attenuation cable has been proposed (e.g. refer to JP-S62-190609). The high frequency attenuation cable is configured such that the tape is narrowed in the width thereof and is wound so as to form gaps, and is wound in double by changing the winding direction. Due to this, a cable in which magnetic lines of force can make one round of the cable, the cable having high flexibility, can be achieved.

SUMMARY OF THE INVENTION

The shield electric wire has the problem that the cable deteriorates in flexibility since the amorphous metal used for the magnetic material tape is extremely hard.

The high frequency attenuation cable has the problem that the amorphous metal extremely hard is difficult to cut into narrow strips and takes time to wind.

It is an object of the invention to provide a noise suppression cable that is excellent in flexibility, easy to wind as well as suppressing the electromagnetic wave noise radiated from the cable.

According to one embodiment of the invention, a noise suppression cable comprises:

an insulated wire comprising a conductor wire and an insulator on a periphery of the conductor wire;

an internal magnetic tape layer comprising a resin layer and a magnetic material layer formed on one surface of the resin layer, the internal magnetic tape layer being spirally wound on a periphery of the insulated wire in a first direction along a longitudinal direction of the cable so as to allow the magnetic material layer of the internal magnetic tape layer to face outside; and an external magnetic tape layer comprising a resin layer and a magnetic material layer formed on one surface of the resin layer, the external magnetic tape layer being spirally wound on a periphery of the internal magnetic tape layer in a second direction different from the first direction along the longitudinal direction of the cable so as to allow the magnetic material layer of the external magnetic tape layer to face inside.

EFFECTS OF THE INVENTION

According to one embodiment of the invention, a noise suppression cable can be provided that is excellent in flexibility, easy to wind as well as suppressing the electromagnetic wave noise radiated from the cable.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Hereinafter, the embodiments according to the invention will be explained referring to the above-mentioned drawings. Further, in the respective drawings, to components having the substantially same function, the same reference signs will be given, and overlapping explanation will be omitted.

Figure 1:
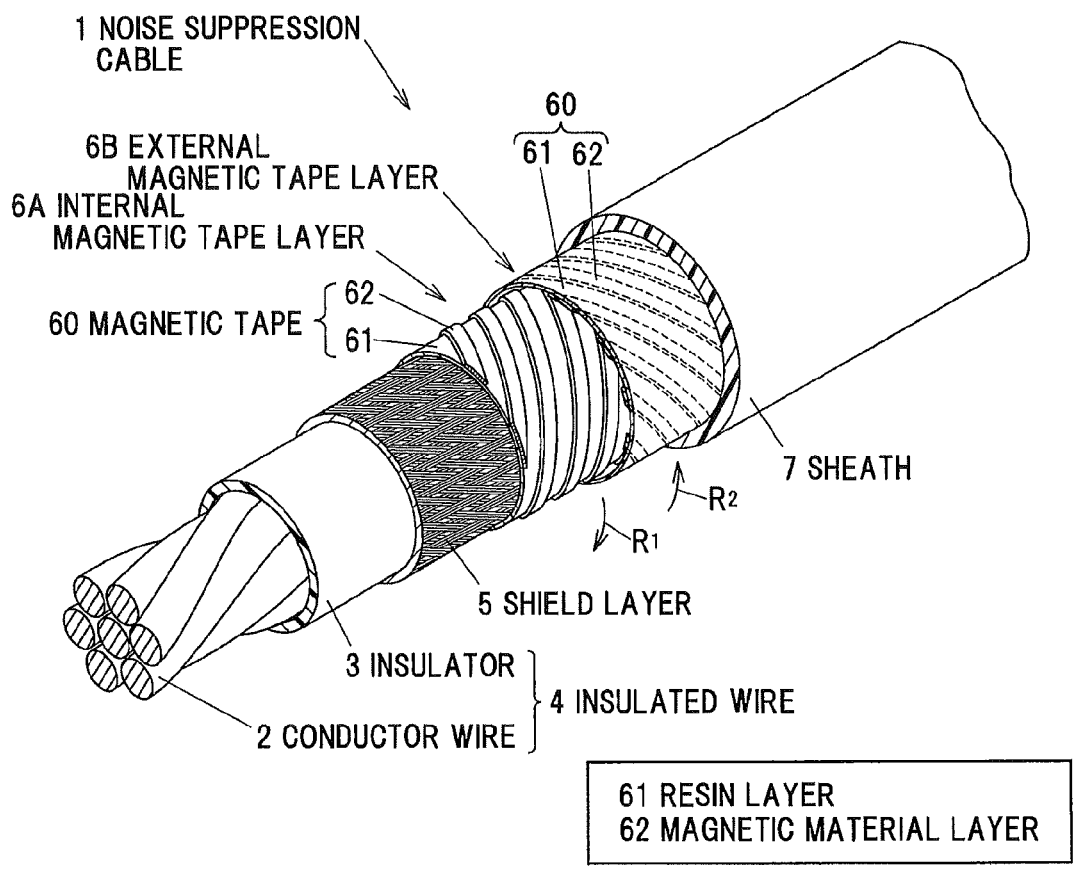
FIG. 1 is a perspective view schematically showing a noise suppression cable according to an embodiment of the invention.
Figure 2:
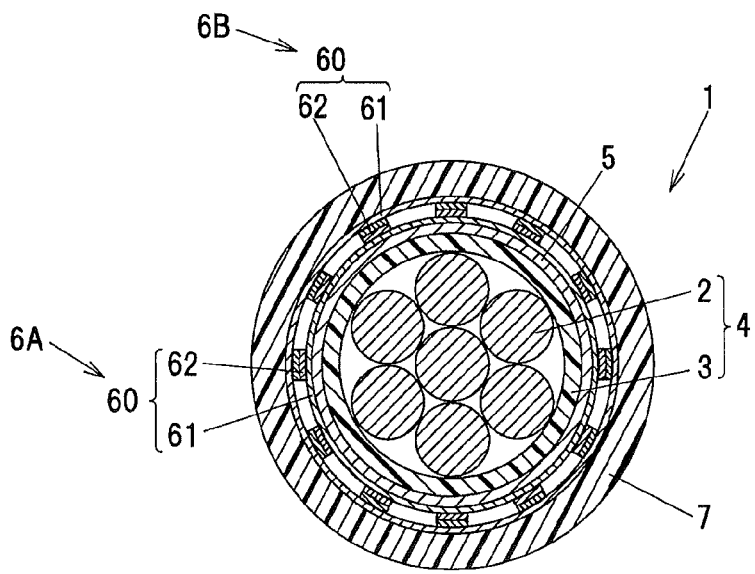
FIG. 2 is a transverse cross-sectional view of the noise suppression cable shown in FIG. 1.
Figure 3:
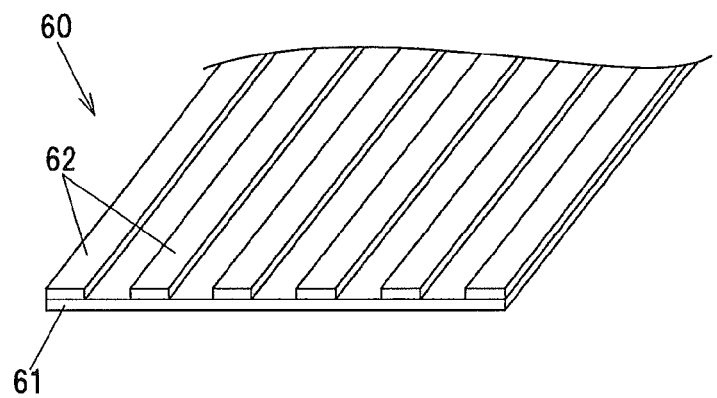
FIG. 3 is a perspective view schematically showing a magnetic tape used in the embodiment of the invention.

FIG. 1 is a perspective view schematically showing a noise suppression cable according to an embodiment of the invention. FIG. 2 is a transverse cross-sectional view of the noise suppression cable shown in FIG. 1. FIG. 3 is a perspective view schematically showing a magnetic tape used in the embodiment of the invention.

As shown in FIG. 1 and FIG. 2, the noise suppression cable 1 includes an insulated wire 4 including a conductor wire 2 constituted of a plurality (7 in the embodiment) of conductors stranded and an insulator 3 with which the periphery of the conductor wire 2 is covered, a shield layer 5 formed on the periphery of the insulated wire 4, an internal magnetic tape layer 6A formed on the periphery of the shield layer 5, an external magnetic tape layer 6B formed on the periphery of the internal magnetic tape layer 6A and a sheath 7 formed on the periphery of the external magnetic tape layer 6B as an insulating protective layer, the sheath 7 being comprised of a resin or the like.

The conductor wire 2 of the insulated wire 4 is a signal wire comprised of a metal such as a copper alloy, and is configured to transmit a signal of, for example, 1 kHz to 10

MHz. Further, the conductor wire 2 may be a solid wire. In addition, each conductor of the conductor wire 2 may be coated.

The insulator 3 is formed by an extrusion molding method using a vinyl chloride resin, an ethylene-vinyl acetate copolymer, a fluorine-based resin, a silicone based resin or the like.

The shield layer 5 is formed by braiding thin wires comprised of a metal such as a copper alloy, and is configured to be connected to a ground of apparatus or the like to which the noise suppression cable 1 is connected.

The sheath 7 is formed, similarly to the insulator 3 of the insulated wire 4, by an extrusion molding method using a vinyl chloride resin, an ethylene-vinyl acetate copolymer, a fluorine-based resin, a silicone based resin or the like. Further, the sheath 7 and the insulator 3 may be constituted of a heat shrinkable tube or the like.

(Configuration of Magnetic Tape)

The internal magnetic tape layer 6A and the external magnetic tape layer 6B are constituted of the same magnetic tape 60. As shown in FIG. 3, the magnetic tape 60 includes a resin layer 61 and a plurality (6 in the embodiment) of magnetic material layers 62 formed on one surface of the resin layer 61.

The internal magnetic tape layer 6A is formed by that the magnetic tape 60 is spirally wound on the periphery of the shield layer 5 in a first direction $R_1$ (right-winding as seen from the left side of FIG. 1) along the longitudinal direction of the noise suppression cable 1 so as to allow the magnetic material layer 62 to face outward.

The external magnetic tape layer 6B is formed by that the magnetic tape 60 is spirally wound on the periphery of the internal magnetic tape layer 6A in a second direction $R_2$ (left-winding as seen from the left side of FIG. 1) different from the first direction $R_1$ along the longitudinal direction of the noise suppression cable 1 so as to allow the magnetic material layer 62 to face inward.

The winding directions of the magnetic tape 60 are differentiated from each other between the internal magnetic tape layer 6A and the external magnetic tape layer 6B, thereby the magnetic material layers 62 of the internal magnetic tape layer 6A and the external magnetic tape layer 6B are brought into contact with each other so as to form annular magnetic paths.

The resin layer 61 can be formed by using a tape comprised of a resin such as a polyethylene terephthalate (PET), a polypropylene based resin.

For the purpose of suppressing the electromagnetic wave noise, it is exemplary that the magnetic material of the magnetic material layer 62 is comprised of a soft magnetic material having low coercive force and high magnetic permeability. As the soft magnetic material, for example, an amorphous alloy such as a Co based amorphous alloy, a Fe based amorphous alloy; a ferrite such as Mn—Zn based ferrite, a Ni—Zn based ferrite, a Ni—Zn—Cu based ferrite; and a soft magnetic metal such as a Fe—Ni based alloy (Permalloy), a Fe—Si—Al based alloy (Sendust), a Fe—Si based alloy (Silicon steel) can be used.

(Manufacturing Method of Magnetic Tape)

Figure 4A:
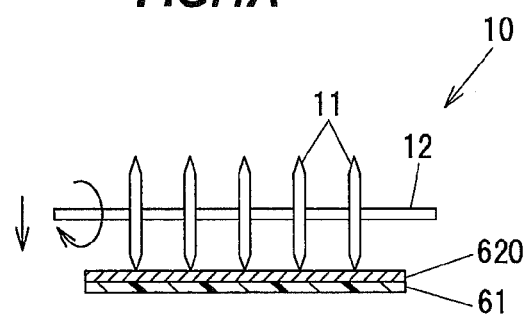
FIGS. 4A to 4C are cross-sectional views schematically showing one example of a method for manufacturing the magnetic tape.
Figure 4B:
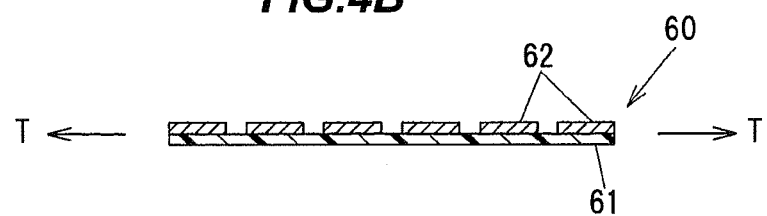
Figure 4C:
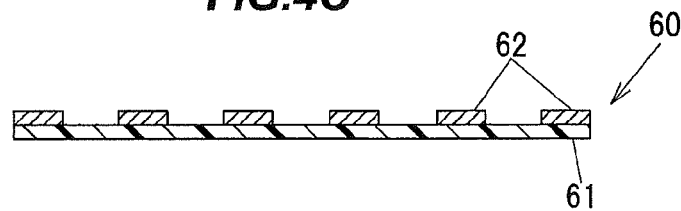

FIGS. 4A to 4C are cross-sectional views schematically showing one example of a method for manufacturing the magnetic tape 60. First, a member including the resin layer 61 and a magnetic material layer 620 formed on one surface of the resin layer 61 is prepared. Next, as shown in FIG. 4A, the magnetic material layer 620 is divided by using a slit machining device 10. The slit machining device 10 includes a plurality of cutters 11, a shaft 12 configured to combine the cutters 11 with each other integrally and rotatably, a motor configured to rotate the shaft 12, and a hydraulic unit configured to push the shaft 12 downward. The shaft 12 is pushed downward while the cutters 11 are rotated, thereby slits are formed in the magnetic material layer 620 along the longitudinal direction, and the magnetic material layer 620 is divided so as to be a plurality of magnetic material layers 62. Next, tensile force T is applied in the width direction to the resin layer 61 on which a plurality of the magnetic material layers 62 divided are mounted. Thereby, as shown FIG. 4C, the magnetic tape 60 is manufactured.

(Winding Method of Magnetic Tape)

Figure 5:
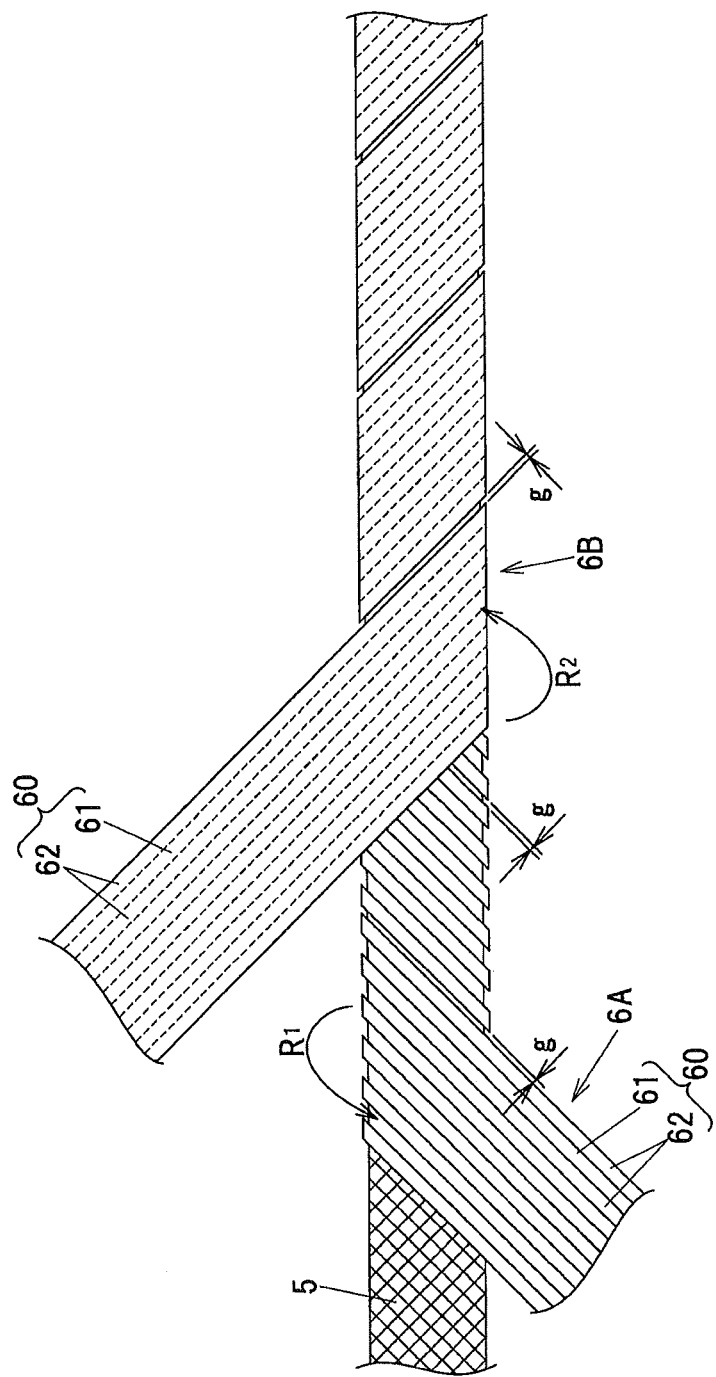
FIG. 5 is a plan view schematically showing one example of a method for winding the magnetic tape.

FIG. 5 is a plan view schematically showing one example of a method for winding the magnetic tape 60. First, the surfaces of the magnetic material layers 62 of the magnetic tape 60 are coated with an adhesive comprised of a thermoplastic resin, the adhesive being melted by heating.

Next, the magnetic tape 60 is wound by an abutting winding on the periphery of the shield layer 5 in the first direction $R_1$ along the longitudinal direction of the noise suppression cable 1 so as to allow the magnetic material layer 62 to face outward and so as to form gaps g, so that the internal magnetic tape layer 6A is formed.

Subsequently, the magnetic tape 60 is wound by an abutting winding on the periphery of the internal magnetic tape layer 6A in the second direction $R_2$ along the longitudinal direction of the noise suppression cable 1 so as to allow the magnetic material layer 62 to face inward and so as to form gaps g, so that the external magnetic tape layer 6B is formed. Next, the noise suppression cable 1 is cooled so as to solidify the adhesive. The magnetic material layers 62 are brought into surface contact with each other, thus magnetic resistance can be reduced. Further, when an adhesive is used, the flexibility of the noise suppression cable 1 is reduced, thus instead of using the adhesive, for example, by using an tightening elasticity of the sheath 7, the surface contact between the magnetic material layers 62 can be also strengthened.

(Action of Internal Magnetic Tape Layer 6A and External Magnetic Tape Layer 6B)

Figure 6:
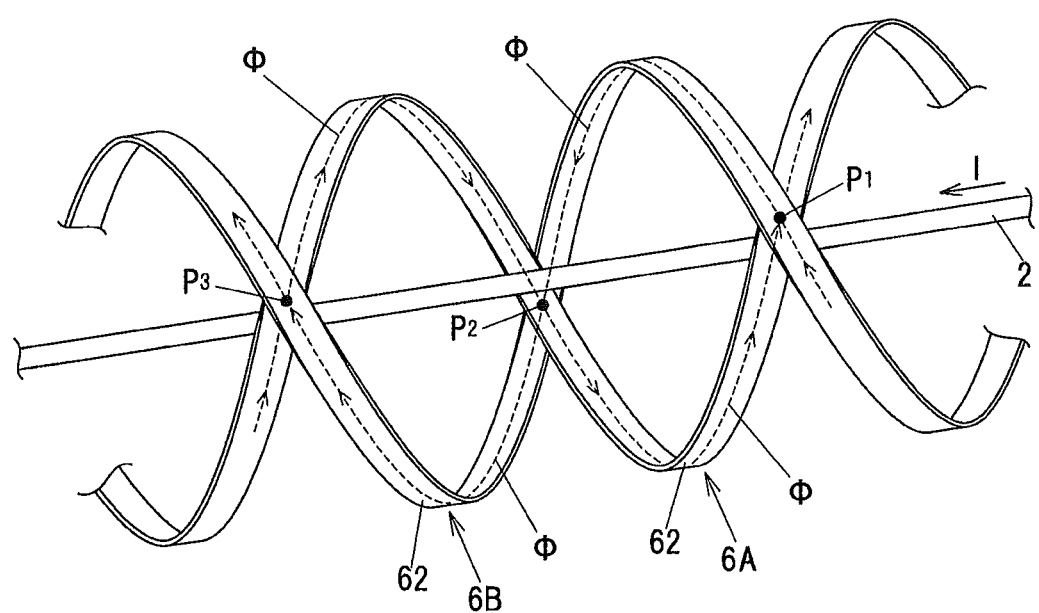
FIG. 6 is an illustration diagram showing an action of an internal magnetic tape layer and an external magnetic tape layer.

FIG. 6 is an illustration diagram showing an action of the internal magnetic tape layer 6A and the external magnetic tape layer 6B. When an electric current I flows through the conductor wire 2 as a signal, due to an electromagnetic wave noise radiated from the conductor wire 2, a magnetic flux $\phi$ occurs in the magnetic material layers 62 of the internal magnetic tape layer 6A and the external magnetic tape layer 6B. The magnetic flux $\phi$ flows annularly through the contact parts $P_1$, $P_2$, $P_3$ of the magnetic material layer 62 of the internal magnetic tape layer 6A and the magnetic material layer 62 of the external magnetic tape layer 6B. As mentioned above, annular magnetic paths through which the magnetic flux $\phi$ flows are formed.

ADVANTAGEOUS EFFECT OF EMBODIMENT

According to the embodiment, the following advantageous effects are provided.

(1) The magnetic tape 60 is configured such that the magnetic material layer 62 thereof is divided along the longitudinal direction, thus flexibility thereof can be heightened.

(2) The magnetic tape 60 is configured such that a plurality of the magnetic material layer 62 are formed, thus winding work thereof can be easily carried out.

(3) Annular magnetic paths are formed by the magnetic material layer 62 constituting the internal magnetic tape layer 6A and the external magnetic tape layer 6B, thus a similar effect to that obtained when a core is mounted is obtained, so that an electromagnetic wave noise radiated from the insulated wire 4 can be suppressed.

(4) A risk of receiving injury by that the magnetic material layers 62 jump out at the time of a terminal treatment or a winding work of the magnetic tape 60 can be reduced.

(5) A ferrite core is not used, thus the appearance can be enhanced and the radiation of the electromagnetic wave noise can be suppressed without troubles such as breaking of the ferrite core concerned with the handling, and without increasing the outer diameter of the noise suppression cable 1.

(Modifications)

Figure 7A:
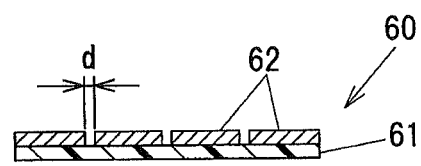
FIGS. 7A to 7B are cross-sectional views schematically showing modifications of the magnetic tape.
Figure 7B:
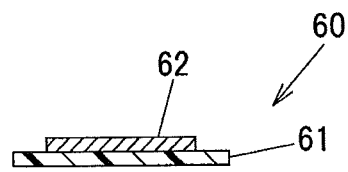

FIGS. 7A to 7B are cross-sectional views schematically showing modifications of the magnetic tape. The magnetic tape 60 shown in FIG. 7A is configured such that slits are formed as the gaps g by the cutter 11 as shown in FIG. 4, but the resin layer 61 is not drawn in the width direction. Even if configured as mentioned above, when the noise suppression cable 1 is bent, the magnetic material layers 62 relatively move in the longitudinal direction, thus the flexibility is not damaged.

The magnetic tape 60 shown in FIG. 7A is configured such that a single magnetic material layer 62 having a width smaller than the resin layer 61 is formed on one surface of the resin layer 61. Even if configured as mentioned above, the annular magnetic paths can be formed by winding such that the magnetic material layer of the magnetic tape of the internal magnetic tape layer and the magnetic material layer of the magnetic tape of the external magnetic tape layer are brought into contact with each other.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, in the above-mentioned embodiment, the internal magnetic tape layer 6A and the external magnetic tape layer 6B are formed over the whole in the longitudinal direction of the noise suppression cable 1, but not particularly limited to this, may be formed only in a certain range in the longitudinal direction of the noise suppression cable 1.

What is claimed is:

1. A noise suppression cable, comprising:
   an insulated wire comprising a conductor wire and an insulator on a periphery of the conductor wire;
   an internal magnetic tape layer comprising a resin layer and a plurality of magnetic material layers formed on one surface of the resin layer, the internal magnetic tape layer being spirally wound on a periphery of the insulated wire in a first direction along a longitudinal direction of the cable so as to allow the plurality of magnetic material layers of the internal magnetic tape layer to face outside; and
   an external magnetic tape layer comprising a resin layer and a plurality of magnetic material layers formed on one surface of the resin layer, the external magnetic tape layer being spirally wound on a periphery of the internal magnetic tape layer in a second direction different from the first direction along the longitudinal direction of the cable so as to allow the plurality of magnetic material layers of the external magnetic tape layer to face inside, wherein, in each of the internal magnetic tape layer and the external magnetic tape layer, the plurality of magnetic material layers are arranged on one surface of the resin layer along the longitudinal direction and spaced from each other with a gap in a width direction,
   wherein the internal magnetic tape layer covers only a part of the insulated wire, and
   wherein the external magnetic tape layer covers only a part of the insulated wire.

2. The noise suppression cable according to claim 1, wherein the internal magnetic tape layer and the external magnetic tape layer each are configured such that the gap between the magnetic material layers is broadened by applying a tensile force to the resin layer in the width direction.

3. The noise suppression cable according to claim 1, further comprising a shield layer braided or laterally wound between the insulated wire and the internal magnetic tape layer.

4. The noise suppression cable according to claim 1, further comprising a shield layer disposed between the insulated wire and the internal magnetic tape layer.

5. The noise suppression cable according to claim 1, further comprising an insulating protective layer disposed on a periphery of the external magnetic tape layer.

6. The noise suppression cable according to claim 1, wherein the first direction is opposite to the second direction.

7. The noise suppression cable according to claim 1, wherein the plurality magnetic material layers of the internal magnetic tape layer contact the plurality of magnetic material layers of the external magnetic tape layer so as to form annular magnetic paths.

8. The noise suppression cable according to claim 1, wherein the first direction and the second direction are differentiated from each other between the internal magnetic tape layer and the external magnetic tape layer such that the plurality magnetic material layers of the internal magnetic tape layer contact the plurality of magnetic material layers of the external magnetic tape layer so as to form annular magnetic paths.

9. The noise suppression cable according to claim 1, wherein the first direction and the second direction of the spiral wounding are set such that the plurality magnetic material layers of the internal magnetic tape layer contact the plurality of magnetic material layers of the external magnetic tape layer so as to form annular magnetic paths.

10. The noise suppression cable according to claim 1, wherein each of the internal magnetic tape layer and the external magnetic tape layer comprise a soft amorphous metal.

11. The noise suppression cable according to claim 1, wherein a first magnetic material layer of the plurality of magnetic material layers of the internal magnetic tape layer is separated from a second magnetic material layer of the plurality of magnetic material layers of the internal magnetic tape layer via the gap.

12. The noise suppression cable according to claim 1, wherein a first magnetic material layer of the plurality of magnetic material layers of the internal magnetic tape layer is separated from a second magnetic material layer of the plurality of magnetic material layers of the internal magnetic tape layer such that a surface of the resin layer of the internal magnetic tape is exposed.

13. The noise suppression cable according to claim 1, wherein the plurality of magnetic material layers are arranged on the one surface of the resin layer along the longitudinal direction and spaced from each other with the gap in the width direction such that an electromagnetic wave noise radiated from the insulated wire suppressed.

14. The noise suppression cable according to claim 1, wherein the noise suppression cable is devoid of a ferrite core.

15. The noise suppression cable according to claim 1, wherein a tensile force is applied to the resin layer in the width direction of the internal magnetic tape layer and the external magnetic tape layer such that a size of the gap between the magnetic layers is broadened.

16. A noise suppression cable, comprising:
an insulated wire comprising a conductor wire and an insulator on a periphery of the conductor wire;
an internal magnetic tape layer comprising a resin layer and a plurality of magnetic material layers formed on one surface of the resin layer, the internal magnetic tape layer being spirally wound on a periphery of the insulated wire in a first direction along a longitudinal direction of the cable so as to allow the plurality of magnetic material layers of the internal magnetic tape layer to face outside; and
an external magnetic tape layer comprising a resin layer and a plurality of magnetic material layers formed on one surface of the resin layer, the external magnetic tape layer being spirally wound on a periphery of the internal magnetic tape layer in a second direction different from the first direction along the longitudinal direction of the cable so as to allow the plurality of magnetic material layers of the external magnetic tape layer to face inside,
wherein the plurality of magnetic material layers are arranged on one surface of the resin layer along a longitudinal direction of each of the internal magnetic tape layer and the external magnetic tape layer,
wherein the plurality of magnetic material layers are spaced from each other with a gap in a width direction of each of the internal magnetic tape layer and the external magnetic tape layer,
wherein the internal magnetic tape layer covers only a part of the insulated wire, and
wherein the external magnetic tape layer covers only a part of the insulated wire.

* * * * *